United States Patent [19]
Shibuya et al.

[11] Patent Number: 5,801,350
[45] Date of Patent: Sep. 1, 1998

[54] SURFACE REFORMATION METHOD OF HIGH POLYMER MATERIAL

[75] Inventors: Tsutomu Shibuya; Kaoru Katayama; Mitugu Shirai; Shinichi Kazui; Hideaki Sasaki; Yasuhiro Iwata, all of Hadano, Japan

[73] Assignee: Hitachi, Ltd., Tokyo, Japan

[21] Appl. No.: 619,186

[22] Filed: Mar. 21, 1996

[30] Foreign Application Priority Data

Mar. 23, 1995 [JP] Japan .................. 7-064496

[51] Int. Cl.$^6$ ............................................. H05K 3/34
[52] U.S. Cl. ................. 204/157.15; 29/840; 228/180.22
[58] Field of Search ................... 204/157.15; 29/840; 228/180.22

[56] References Cited

U.S. PATENT DOCUMENTS

| | | | |
|---|---|---|---|
| 3,161,752 | 12/1964 | Stuart | 219/69 |
| 3,755,886 | 9/1973 | Hermann | 29/496 |
| 3,978,341 | 8/1976 | Hoell | 250/492 R |
| 4,960,236 | 10/1990 | Hedges et al. | 228/248 |

FOREIGN PATENT DOCUMENTS

| | | |
|---|---|---|
| 03052936 | 3/1991 | Japan . |
| 06164123 | 6/1994 | Japan . |

OTHER PUBLICATIONS

CAPLUS abstract of Hiroyuki et al. ("Surface modifications of Kapton and cured polyimide films by argon fluoride (ArF) excimer laser: applications to imagewise wetting and metalization", Appl. Surf. Sci. (1990), 46(1–4), 264–71), no month available.

JAPIO abstract of JP03052936 (NITTO DENKO Corp.) Mar. 7, 1991.

WPIDS abstract of JP03052936 (NITTO DENKO Corp.), Mar. 7, 1991.

Hiroyuki et al. ("Surface properties of photoablated thermostable polymers", MAter. Res. Soc. Symp. Proc. (1991), 227(MAter. Sci. High Temp. Polym. Microelectron.), 329–34, no ,onth available.

Primary Examiner—Kathryn L. Gorgos
Assistant Examiner—Alex Noguerola
Attorney, Agent, or Firm—Fay, Sharpe, Beall, Fagan, Minnich & McKee

[57] ABSTRACT

A surface reformation method of a high polymer material irradiates an excimer-laser beam to only a predetermined area in which electronic parts and the like are temporarily immobilized by a liquid on a substrate which has a high polymer layer on the surface. The wettability of the liquid for temporary immobilization only with respect to the predetermined area is improved. After the electronic parts are temporarily immobilized on the substrate by using the method, the electronic parts can be durably soldered by fluxless reflow soldering.

19 Claims, 5 Drawing Sheets

SURFACE REFORMATION METHOD OF HIGH POLYMER MATERIAL

BACKGROUND OF THE INVENTION

The present invention relates to a surface reformation method of a high polymer material and, more particularly, to a surface reformation method of a high polymer material which is preferable to be used in order to improve wettability of a liquid used for temporarily immobilizing electronic parts on an electronic circuit board, the surface of which is covered by a high polymer material layer. The invention also relates to improvement of wettability of a liquid used for temporary immobilization of electronic parts when the electronic parts are soldered on an electronic circuit board according to a fluxless reflow soldering.

As a conventional technique regarding a surface reformation method for wettability improvement of a high polymer material, for example, methods using an $O_2$ asher, Ar sputter, or the like are known. In these methods, a process is performed by setting a circuit board on which a high polymer material layer to be processed is coated in a vacuum vessel, and the surface reformation is executed for the entire surface of the high polymer material on the substrate.

According to the conventional technique using, for example, the $O_2$ asher or Ar sputtering mentioned above, the surface of the substrate can be reformed only in an atmosphere of vacuum, and there is a problem such that a large-scaled apparatus including vacuum equipment, vacuum vessel, and the like is necessary. According to the conventional technique, since the surface reformation is executed for the entire surface of the high polymer material on the substrate, an area which is not necessary to be processed other than the area on which the electronic parts are temporarily immobilized on the electronic circuit board or the like is also reformed. Consequently, the liquid used for the temporary immobilization of the electronic parts wets the portion which is unnecessary for the temporary immobilization of the parts, so that there is a problem such that a large amount of liquid is wasted. As mentioned above, when the entire surface of the high polymer material on the substrate is reformed and the liquid for temporary immobilization wets even the unnecessary portion, even if the parts are temporarily immobilized, the parts are moved from positions of the temporary immobilization at the time of reflow soldering, so that the object of the temporary immobilization cannot be achieved. Particularly, when the size of the substrate is equal to 50 mm×50 mm or larger, since the liquid for temporary immobilization tends to gather in the center and the temporarily immobilized parts easily move, it is not preferable. Hitherto, a flux for soldering has been commonly used in the temporary immobilization of the parts in the reflow soldering and the parts are not moved from the positions of the temporary immobilization. In case of performing the reflow soldering without using the flux, however, when the liquid for temporary immobilization wets the unnecessary portion, the object of the temporary immobilization is not achieved as mentioned above. It is, therefore, conventionally difficult to solder the electronic parts at predetermined positions on the electronic circuit board by performing a fluxless reflow soldering.

SUMMARY OF THE INVENTION

It is an object of the present invention to provide a surface reformation method of a high polymer material which solves the problems of the conventional technique and which can perform a surface reformation of a substrate in which wettability for a liquid employed for temporary immobilization is improved with respect to only an area necessary for temporary immobilization of electronic parts without needing vacuum equipment, vacuum vessel, and the like. The surface reformation here denotes the reformation of the properties of the surface for improving the wettability of the liquid for temporary immobilization.

The above-mentioned object of the present invention is achieved by irradiating the high polymer material surface with light energy, only at the area to be treated (that is, an area to be wetted by the liquid for temporary immobilization.

According to the present invention, by applying the light energy to only the area which needs the surface reformation of the present high polymer material, the surface of the only portion which is irradiated with the light energy can be reformed and the wettability for the liquid can be improved only in the necessary area. Consequently, the liquid for temporarily immobilizing the electronic parts and the like can make only the processed area wet, the processed area can be wetted by a minimum amount of the liquid, and the electronic parts can be certainly temporarily immobilized at predetermined positions on the surface of the high polymer material.

As a base material of a substrate on which the high polymer material layer is provided, any substrate used for an integrated circuit such as, for example, a printed board, glass plate, or ceramic plate can be used.

A polyimide system resin is used for the high polymer material layer on which the electronic parts are mounted. As the polyimide system resin, polyimide isoindroquinazolindion (PIQ; trade name of Hitachi Chemical Co., Ltd.) and polymethylmethacrylate (PMMA) can be usually employed. In addition, OFPR (trade name of Tokyo Ohka Kogyo Co., Ltd.) and B20 (trade name of Hitachi Chemical Co., Ltd.) are also suitable.

A wavelength of the light energy which is thrown onto the surface of the high polymer material lies in a range from 100 nm to 600 nm. When the wavelength of the irradiation light is too short, the irradiation light is transmitted to the inside of the high polymer material. When the wavelength is too long, abrasion of the high polymer material surface is insufficient. Both of these cases are not preferable.

An energy density of the irradiation light is set to larger than 0.03 J/cm$^2$ and is equal to 0.5 J/cm$^2$ or less. When the energy density is equal to 0.03 J/cm$^2$ or less, a contact angle of the liquid for temporary immobilization is equal to 20 degrees or larger, so that the improvement of the wettability is insufficient. It is not preferred that the energy density exceed 0.5 J/cm$^2$, damage caused to the resin layer is impermissibly large when the thickness of the polyimide system resin layer is equal to 0.5 µm or less.

As light energy which satisfies the above conditions, an excimer-laser beam can be used in the present invention.

Irradiation by the excimer-laser beam is performed by throwing a pulse of 20 ns to 100 ns (pulse duration is 20 ns to 100 ns) at least once. The pulse duration is set to 20 ns to 100 ns, because the pulse duration of the excimer-laser beam is equal to from 20 ns to 100 ns at the present technique level, but it is not an absolute condition. The energy of each pulse of the irradiation pulse of the light energy exceeds 0.03 J/cm$^2$ and is equal to 0.5 J/cm$^2$ or less. At least one pulse of the light irradiation is necessary. Although the number of pulses can be one or more, the cost increases when the number is set to an unnecessarily large number, so that it is usually set to 5 times or fewer.

As a liquid for temporary immobilization, for example, an alcohol system liquid such as tetraethylene glycol or pentaethylene glycol or an ester system liquid such as ethyl salicylate can be used.

A proper amount of the liquid for temporary immobilization is adhered to a predetermined area by, for example, dropping the liquid in the predetermined area. An adhesion amount of the liquid for temporary immobilization is set to an amount sufficient to wet the predetermined area on the surface of the high polymer material to temporarily immobilize the electronic parts and ordinarily set to 4.5 cc to 13.5 cc for an area of 16 mm×16 mm (that is, 0.017 cc/mm² to 0.053 cc/mm²).

According to the method of the present invention, by temporarily immobilizing the electronic parts on the high polymer material layer on the substrate, the electronic parts can be easily soldered at positions where the electronic parts are temporarily immobilized in a step of the fluxless reflow soldering after that.

In order to solder the electronic parts on the substrate, a metal pattern for the soldering can be provided in at least an area to be soldered on the substrate. The metal pattern in this case is constructed by a solderable metal (for example, Cu) and the thickness can be any thickness as long as it is easily soldered. The soldering can be performed in accordance with, for example, the micro Ball Grid Array (micro BGA) method or CCB (Controlled Collapse Bonding) method. A metal layer of a predetermined shape is provided on the surface of the base material of the substrate, and the high polymer material layer having holes corresponding to predetermined positions of the metal layer is coated on the substrate on which the metal layer is provided. On the other hand, a solder ball is provided for the electronic part at a position corresponding to the hole section and the solder ball and the metal layer exposed at the hole section of the high polymer layer are aligned, thereby temporarily immobilizing the electronic parts.

In the method of the present invention using the irradiation light of the energy density in the above range, the metal pattern for soldering is not damaged and the surface reformation of the high polymer material as an insulating material can be performed.

BRIEF DESCRIPTION OF THE DRAWINGS

FIG. 7b is a schematic perspective view showing a state in which the liquid is spread after the step of FIG. 7a;

FIG. 8b is a graph showing the relation between the contact angle of the liquid for temporary immobilization and the energy density of the irradiation light in the embodiment of FIG. 8a.

DESCRIPTION OF THE PREFERRED EMBODIMENTS

EMBODIMENT 1

Figure 1:
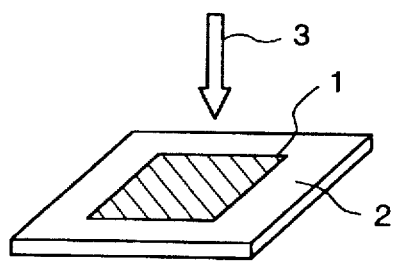
FIG. 1 is a schematic perspective view for explaining a surface reformation method of a high polymer material in one embodiment of the present invention.

Embodiment 1 will be described hereinbelow with reference to the drawings. In the drawings, reference numeral 1 denotes a laser irradiation area; 2 a substrate; 3 a laser beam; 4 a high polymer material layer; 5 a base material; 6 an electronic part; 7 a liquid for temporary immobilization; 8 a metal wiring; 9 an area worked by an $O_2$ asher; 10 a pipette; 11 a wetted area; 12 a solder ball; 13 an electrode; 14 a metal pattern; and 15 a hole section.

Figure 2:
FIG. 2 is a section view showing a construction of a substrate in one embodiment of the present invention.
Figure 3:
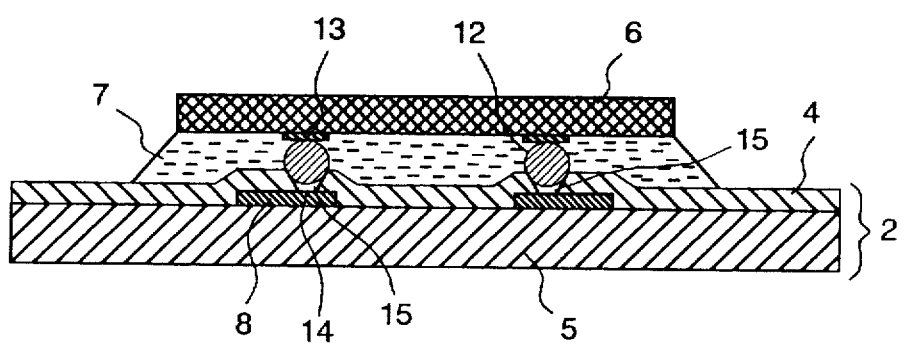
FIG. 3 is a section view showing a state in which electronic parts are temporarily immobilized on a substrate in one embodiment of the present invention.

In the present embodiment, as shown by a construction example in FIG. 2, the substrate 2 to be processed in accordance with the surface reformation method for the high polymer material is constructed in a manner such that the high polymer material layer 4 such as PIQ (polyimide isoindroquinazolindion), PMMA (polymethylmethacrylate), or the like is coated as an insulating material on the surface of the base material 5 such as ceramic or the like. On such a substrate 2, metal wiring necessary for forming an electronic circuit is performed and electronic parts such as LSI and the like are soldered at predetermined positions. The substrate 2 in the present embodiment has a square shape of 150 mm×150 mm and a thickness of 5 mm. As shown in FIG. 3, the high polymer material layer 4 is formed on the surface of the substrate base material 5 on which the metal wiring 8 is arranged. There are hole sections 15 at predetermined positions of the high polymer material layer 4. At the positions, the metal wiring 8 is exposed to form the metal pattern 14 to be soldered.

The present embodiment intends to improve the wettability of only a necessary portion on the substrate 2 for the liquid 7 for temporary immobilization in case of temporarily immobilizing the electronic parts 6 and the like by using the liquid 7 for temporary immobilization when the electronic parts 6 such as LSI and the like are soldered.

As shown in FIG. 1, the surface reformation method of the high polymer material 4 according to the present embodiment is executed by applying the light energy by the laser beam 3 to the laser irradiation area 1 to which the electronic parts 6 are temporarily immobilized on the substrate 2 which is coated by the high polymer material layer 4. As a light source of the laser beam 3, an excimer-laser is used. It is particularly preferable that the wavelength of the laser beam 3 lies within a range from 100 nm to 600 nm and the energy density lies within a range from 0.05 J/cm² to 0.5 J/cm².

When an alcohol system solvent such as tetraethylene glycol, pentaethylene glycol, or the like as a liquid 7 for temporarily immobilizing the electronic parts is dropped onto the laser irradiation area 1 on the surface of the substrate 2 to which the surface reformation has been performed by irradiating the laser beam 3, the liquid 7 evenly wets in the laser irradiation area 1 and does not wet the unprocessed surface of the substrate 2. The electronic parts 6 such as an LSI and the like can be temporarily immobilized by the liquid 7 at the predetermined positions on the substrate 2 to which an embodiment of the present invention has been performed before soldering as shown in FIG. 3.

Figure 4:
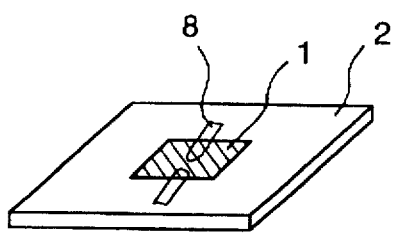
FIG. 4 is a schematic perspective view showing a state in which a metal pattern is damaged because of the improper intensity of an irradiation light.

Even in the case where the surface reformation method of the high polymer material according to the present embodiment is performed to the surface of the substrate 2 on which the metal pattern 14 exists for the soldering, the surface of the high polymer material layer 4 coated on the substrate 2 can be reformed without damaging the metal wiring 8. When the energy density of the laser beam 3 is remarkably larger than the values indicated in the invention, for example, equal to 20 J/cm$^2$, the metal wiring 8 is damaged as shown in FIG. 4 and can be broken.

Figures 5A, 5B, 5C:
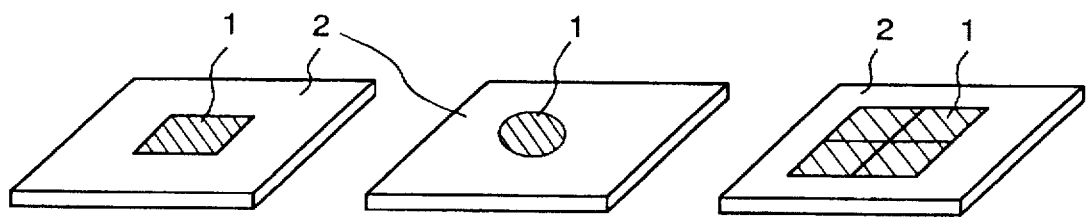
FIGS. 5a, 5b, and 5c are perspective views showing substrates to which light energy is applied so that patterns of irradiation areas are a square, a circle, and a shape obtained by gathering a plurality of patterns on the substrate respectively.

Further, in the method according to the embodiment of the present invention, the shape of the laser irradiation area 1 can be optional in accordance with the sectional shape of the laser beam 3 to be irradiated as shown in FIGS. 5a, 5b and 5c. For example, it can be a square shown in FIG. 5a, a circle shown in FIG. 5b, and a shape obtained by gathering a plurality of shapes for reforming a wide region shown in FIG. 5c. The method according to the present embodiment is effective in the atmosphere, vacuum, or He assist and can in such circumstance reform the surface of the high polymer material layer 4. The He assist denotes an atmosphere during spraying He in order to blow off dusts. By spraying He, dusts can be blown off further than spraying other gas.

A state of wettability with respect to the liquid when the method according to the foregoing embodiment is performed will be described in comparison with the case of the conventional technique with reference to FIGS. 6a and 6b.

Figures 6A, 6B:
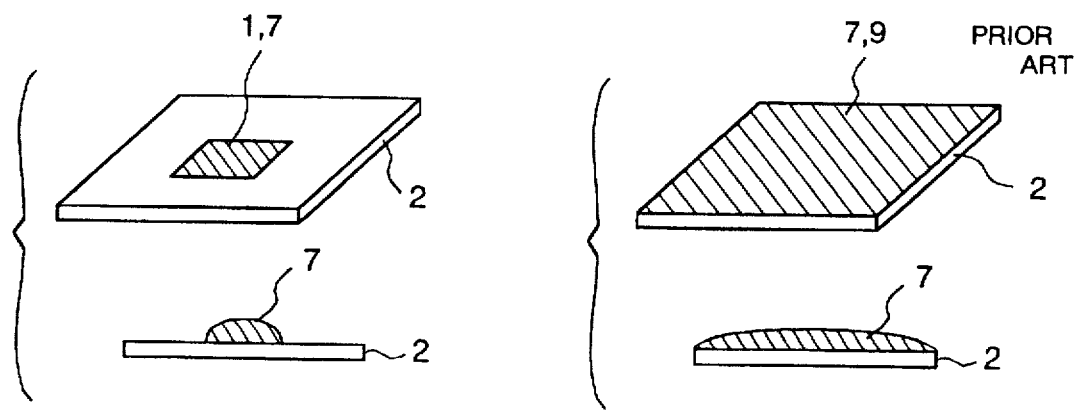
FIG. 6a is an explanatory diagram showing a wet state by a liquid in one embodiment of the present invention.
FIG. 6b is an explanatory diagram showing a wet state by a liquid in the conventional technique.

As shown in FIG. 6a, the liquid 7 as an alcohol system solvent in case of performing the method according to the embodiment wets only a portion of the area 1 which was irradiated by the laser beam. This is because the portion which is not subjected to the process according to the present embodiment does not allow the liquid 7 to wet due to the surface tension even when the liquid is dropped to the not processed portion or the liquid tries to invade from the area 1 to which the laser beam has been thrown.

On the other hand, in case of the method according the conventional technique using the O$_2$ asher, as shown in FIG. 6b, the area 9 to be worked by the O$_2$ asher cannot be limited to a specific area and the entire surface of the substrate is processed. The liquid 7 consequently wets the whole surface of the substrate 2.

As mentioned above, in the present embodiment in which only the predetermined area on the substrate 2 is set to the laser beam irradiation area 1, the liquid 7 for temporary immobilization wets only the laser beam irradiation area 1 as shown in FIG. 6a. The electronic parts 6 having the solder ball 12 on the electrode 13 as shown in FIG. 3 are mounted on the substrate 2 of which only a predetermined area is wet by the liquid 7 for temporary immobilization, and the electronic parts 6 are temporarily immobilized in a manner such that the solder ball 12 faces the metal pattern 14 through the hole section 15 of the high polymer material layer 4. The substrate 2 on which the electronic parts 6 are set as mentioned above is reflow soldered, thereby soldering the electronic parts to the predetermined positions on the substrate. The flux is not particularly used. The residual liquid for temporary immobilization after the completion of the soldering is evaporated by putting the substrate in a vacuum atmosphere.

On the other hand, when the surface of the high polymer material is not especially processed (when the irradiation of the light energy, the work by the O$_2$ asher, sputtering, and the like are not performed), the surface of the high polymer material is not wet by the alcohol system solvent, and the electronic parts cannot be temporarily immobilized, so that the electronic parts cannot be soldered by the fluxless reflow soldering.

When the surface of the high polymer material is processed by the O$_2$ asher or Ar sputtering as in the conventional technique, the liquid for temporary immobilization spreads over the entire surface of the high polymer material and the electronic parts cannot be soldered to the predetermined positions on the substrate by the fluxless reflow soldering as mentioned above.

EMBODIMENT 2

A method of evaluating the method according to the present embodiment of the present invention will now be described with reference to FIGS. 7a to 7e.

Figure 7A:
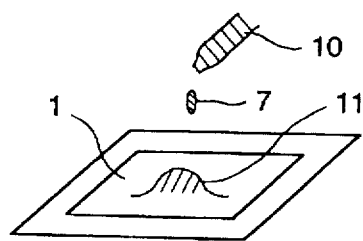
FIG. 7a is a schematic perspective view showing a step of dropping a liquid for temporary immobilization onto a substrate in order to evaluate the wettability for the liquid used in one embodiment of the present invention.
Figure 7B:
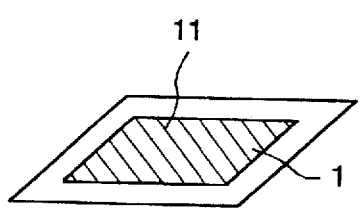

First, the substrate 2 having a square area of 150 mm ×150 mm and thickness of 5 mm is prepared as a sample as shown in FIG. 2, and by the excimer-laser beam having a wavelength of 308 nm, energy density of 0.1 J/cm$^2$, and pulse duration of 30 ns is irradiated once at a 16 mm×16 mm square. After that, as shown in FIG. 7a, the liquid 7 of the alcohol system solvent, that is, tetraethylene glycol or pentaethylene glycol of about 4.5 cc to 13.5 cc, typically about 9 cc is dropped by using the pipette 10. The droplet wets the whole surface in a predetermined area as shown in FIG. 7b. The droplet spread by wetting is left for 15 minutes. When the liquid 7 remains spread on the entire surface of the predetermined processed area and is not leaked out of the processed area as shown in FIG. 7c, it is evaluated that the surface is sufficiently reformed.

Figure 7C:
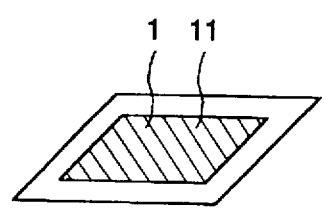
FIGS. 7c, 7d, and 7e are schematic perspective views showing states in which the liquid is further spread after the step of FIG. 7b, and the wet states of the liquid come to be evaluated.
Figure 7D:
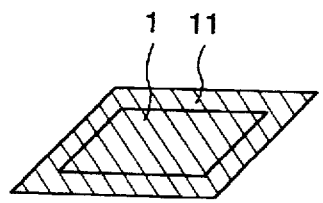
Figure 7E:
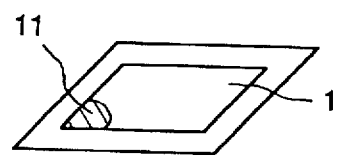

On the other hand, a case where it is evaluated that the surface is not sufficiently reformed is shown in FIGS. 7d and 7e. FIG. 7d shows a state where the liquid 7 wets even out of the predetermined area 1. FIG. 7e shows a state where an area wetted by the liquid 7 is reduced and a portion which is not wetted by the liquid 7 appears on the predetermined area 1. The surface reformation is insufficient in both of these cases.

In case of irradiating the surface of the high polymer material by the light energy under the conditions of the present invention, a preferred result shown in FIG. 7c can be obtained.

EMBODIMENT 3

An experimental result for obtaining the optimum energy density of the excimer-laser beam according to the present embodiment will now be described with reference to FIG. 8.

Figure 8A:
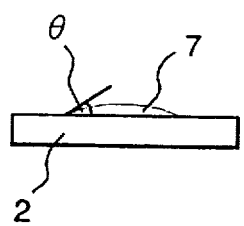
FIG. 8a is a schematic section view for explaining a contact angle for judging the wettability for the liquid in another embodiment of the present invention.

The surface reformation can be evaluated by measuring the contact angle θ between the surface of the liquid 7 for temporary immobilization and the surface of the substrate when the temporary immobilizing liquid is dropped onto the surface of the substrate 2 as shown in FIG. 8a. When the contact angle θ is equal to 20 degrees or less, it can be usually evaluated that the surface reformation regarding the wettability is sufficient. As is known, the contact angle is measured by photographing the side and measuring the contact angle in the photograph. The surface of the substrate 2 is composed of PIQ. The irradiation condition of the laser beam, kind of the temporary immobilizing liquid, and dropping condition of the temporary immobilizing liquid are the same as those in the embodiment 2. The energy density of the laser beam is changed in a range shown by the axis of abscissa of FIG. 8b.

Figure 8B:
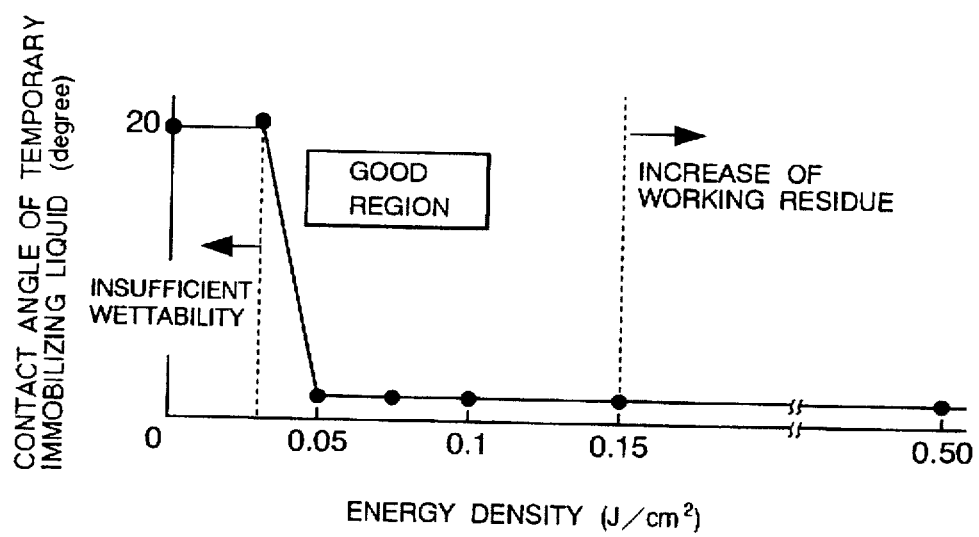

FIG. 8b shows the experimental result indicating the relation between the energy density of the excimer-laser beam and the contact angle θ mentioned above.

As will be clearly understood from FIG. 8b, when the energy density of the excimer-laser exceeds 0.03 J/cm$^2$, the contact angle θ becomes 20 degrees or less and the effect of the invention can be obtained. When the energy density is equal to 0.05 J/cm$^2$ or larger, the contact angle θ is sufficiently smaller than 20 degrees and it is further preferable. When the energy density exceeds 0.5 J/cm$^2$, however, it is not preferable since the damage caused to the high polymer material layer becomes large as mentioned above. It is preferable that the energy density is equal to 0.5 J/cm$^2$ or less. When the energy density exceeds 0.15 J/cm$^2$, there is a tendency such that a residue after working increases, so that it is further preferable that the energy density is set to 0.15 J/cm$^2$ or less.

In the present invention, the energy density of the excimer-laser beam is consequently set to larger than 0.03 J/cm$^2$ and is equal to 0.5 J/cm$^2$ or less and, preferably, it is equal to 0.05 J/cm$^2$ or larger and is equal to 0.15 J/cm$^2$ or less.

In the present embodiment, the pulse of the excimer-laser beam for 30 ns is irradiated only once onto the substrate, thereby obtaining the data. When the pulse is irradiated three times or when the irradiation time is set to from 20 ns to 100 ns, it is confirmed that an almost similar result can be obtained. Further, when PMMA is used for a high polymer material, substantially the same result can be also obtained.

When the laser irradiation condition by which the preferred result is obtained in the present embodiment is applied to Embodiment 2, the preferred result can be also obtained.

According to the surface reformation method of the high polymer material according to the present invention as mentioned above, by applying the light energy to only the area which needs the surface reformation of the high polymer material, the surface reformation of only the portion to which the light energy is irradiated can be performed and the wettability of the liquid can be improved only in the necessary area. Thus, the liquid for temporarily immobilizing the electronic parts and the like without needing the vacuum equipment or the like can be wetted only in the process area and the process area can be wetted with the minimum amount.

According to the invention, since the surface reformation of only the necessary area can be performed, the electronic parts and the like can be temporarily immobilized on the substrate by using the minimum amount of the liquid for temporary immobilization.

When the surface reformation is executed by using the surface reformation method of the high polymer material of the present invention, the electronic parts and the like are temporarily immobilized on the substrate by using the liquid for temporary immobilization after that and the fluxless reflow soldering is performed, thereby enabling the soldering of the electronic parts and the like on the substrate to be executed with preferable durability.

In the surface reformation method of the high polymer material of the invention, even when the metal pattern for soldering exists in the light energy irradiation area, the metal pattern is not damaged.

What is claimed is:

1. A method of processing an electronic circuit board on which an electronic part is mounted and connected to a metal pattern on said circuit board, a surface of said metal pattern being covered with a high polymer material layer, said method comprising the following steps:

irradiating light energy on an area on a surface of said high polymer material layer where said electronic part is to be mounted;

providing a liquid for temporary immobilization on said area;

mounting said electronic part through a solder which is on said area on which said liquid for temporary immobilization is provided; and fixing said electronic part to said metal pattern, by heating said solder.

2. A method according to claim 1, wherein said high polymer material is a polyimide system resin.

3. A method according to claim 2, wherein said polyimide system resin is polyimide isoindroquinaqolindion or polymethylmethacrylate.

4. A method according to claim 1, wherein said light energy has a wavelength lying in a range from 100 nm to 600 nm, and an energy density which exceeds 0.03 J/cm$^2$ and is less than or equal to 0.5 J/cm$^2$.

5. A method according to claim 4, wherein said light energy is generated by an excimer-laser beam.

6. A method according to claim 5, wherein said light energy irradiates at least once by emitting a light energy pulse having a duration lying in a range from 20 ns to 100 ns.

7. A method according to claim 4, wherein the energy density of said light energy is equal to 0.05 J/cm$^2$ or larger.

8. A method according to claim 4, wherein the energy density of said light energy is equal to 0.15 J/cm$^2$ or less.

9. A method according to claim 4, wherein a metal pattern for soldering is provided in said desired area of said high polymer material.

10. A method according to claim 1, wherein said light energy is emitted in any one of the atmosphere, vacuum, and He assist.

11. A method according to claim 1, wherein said liquid is an alcohol system liquid.

12. A method according to claim 1, wherein said liquid consists essentially of, tetraethylene glycol, or pentaethylene glycol.

13. A method according to claim 1, wherein a metal pattern for soldering is provided on said area.

14. A method of processing an electronic circuit board on which a plurality of electronic parts are mounted and connected to a metal pattern on said circuit board, a surface of said metal pattern being covered with a high polymer material layer, said method comprising the following steps:

irradiating light energy on each area on a surface of said high polymer material layer where each of said plurality of electronic parts is to be mounted;

providing a liquid for temporary immobilization on said each area;

mounting each of said electronic parts through a solder which is on said each area on which said liquid for temporary immobilization is provided; and fixing each of said electronic parts to said metal pattern, by heating of said solder on said each area.

15. A method according to claim 14, wherein said each area where each of said plurality of electronic parts is to be mounted is greater than a contact area between each of said electronic parts and said high polymer material layer, when said each of said electronic parts is mounted on said metal pattern.

16. A method of processing an electronic circuit board on which a plurality of electronic parts are mounted and connected to a metal pattern on said circuit board, a surface of said metal pattern being covered with a high polymer material layer, said method comprising the following steps:

irradiating light energy on each area on a surface of said high polymer material layer where each of said plurality of electronic parts is to be mounted;

providing an alcohol system liquid on said each area;

mounting each of said electronic parts through a solder which is on said each area on which said alcohol system liquid is provided; and fixing each of said electronic parts to said metal pattern, by heating of said solder on said each area.

17. A method according to claim 16, wherein said alcohol system liquid evaporates in said fixing step.

18. A method according to claim 16, wherein said step of fixing further comprises a step of evaporating said alcohol system liquid by placing said metal pattern to which said electronic parts are fixed in a vacuum environment.

19. A method of processing an electronic circuit board on which a plurality of electronic parts are mounted and connected to a metal pattern on said circuit board, a surface of said metal pattern being covered with a layer of a high polymer material of polyimide system resin, said method comprising the following steps:

irradiating with an excimer-laser beam an area on a surface of said high polymer material layer where each of said plurality of electronic parts is to be mounted;

providing an alcohol system liquid on said each area;

mounting each of said electronic parts through a solder which is on said each area; and fixing each of said electronic parts to said metal pattern, by heating of said solder on said each area.

\* \* \* \* \*